United States Patent
Wang et al.

(10) Patent No.: US 8,569,779 B2
(45) Date of Patent: Oct. 29, 2013

(54) LIGHT EMITTING DIODE PACKAGE

(75) Inventors: Kai-Lun Wang, Hsinchu (TW);
Shih-Yuan Hsu, Hsinchu (TW); Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 59 days.

(21) Appl. No.: 13/209,451

(22) Filed: Aug. 15, 2011

(65) Prior Publication Data

US 2012/0153326 A1  Jun. 21, 2012

(30) Foreign Application Priority Data

Dec. 21, 2010  (CN) .......................... 2010 1 0595678

(51) Int. Cl.
*H01L 33/00* (2010.01)

(52) U.S. Cl.
USPC  257/98; 257/99; 257/E33.057; 257/E33.061; 257/E33.072; 257/E33.075

(58) Field of Classification Search
USPC ................ 257/98, 99, E33.057, E33.061, 257/E33.072, E33.075
See application file for complete search history.

(56) References Cited

U.S. PATENT DOCUMENTS

| | | | |
|---|---|---|---|
| 8,421,088 B2 * | 4/2013 | Konishi et al. | 257/79 |
| 8,431,947 B2 * | 4/2013 | Kim | 257/98 |
| 8,431,954 B2 * | 4/2013 | Lee et al. | 257/100 |
| 8,450,761 B2 * | 5/2013 | Kishimoto et al. | 257/98 |
| 2009/0321768 A1 * | 12/2009 | Chang | 257/98 |
| 2012/0241781 A1 * | 9/2012 | Yuan et al. | 257/89 |
| 2013/0037748 A1 * | 2/2013 | Kato et al. | 252/301.36 |

FOREIGN PATENT DOCUMENTS

| | | |
|---|---|---|
| TW | M366013 U | 10/2009 |
| TW | 200952134 A | 12/2009 |
| TW | 201005212 A | 2/2010 |
| TW | M381742 U | 6/2010 |

* cited by examiner

*Primary Examiner* — Victor A Mandala
(74) *Attorney, Agent, or Firm* — Altis & Wispro Law Group, Inc.

(57) ABSTRACT

An exemplary light emitting diode (LED) package includes a substrate, an electrical member formed on the substrate, an LED chip mounted on the substrate and electrically connected to the electrical member, and a heat-dissipating member formed on the electrical member. The heat-dissipating member helps the LED chip to dissipate heat generated thereby when the LED chip is in operation.

14 Claims, 1 Drawing Sheet

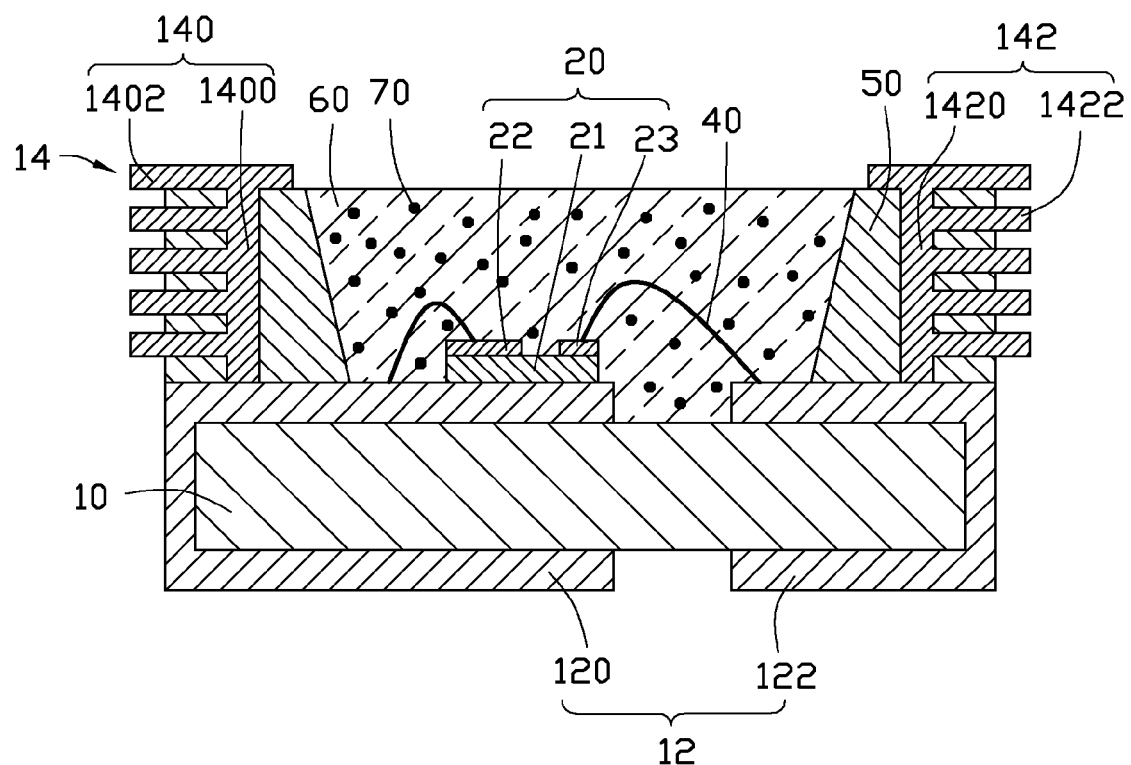

LIGHT EMITTING DIODE PACKAGE

BACKGROUND

1. Technical Field

The disclosure relates to light emitting diode (LED) packages, and particularly to an improved LED package having a good heat dissipation.

2. Description of the Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical LED package includes a substrate, an LED chip disposed on the substrate and an encapsulation material encapsulating the LED chip. In use, the LED chip has a rapid rise in operating temperature. However, since the LED package lacks effective heat dissipation mechanisms, continuous operation of the LED chip can cause the LED package to overheat, resulting in a flickering or even a malfunction of the LED package.

Therefore, it is desirable to provide a light emitting diode package which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

The only drawing is a schematic, cross-sectional view of a light emitting diode (LED) package according to an exemplary embodiment of the present disclosure.

DETAILED DESCRIPTION

Referring to the only drawing, a light emitting diode (LED) package in accordance with an exemplary embodiment of the present disclosure is illustrated. The LED package includes a substrate 10, an electrical member 12 formed on the substrate 10, a heat-dissipating member 14 formed on the electrical member 12, an LED chip 20 mounted on the substrate 10, two wires 40 electrically connecting the LED chip 20 to the electrical member 12, an annular reflecting cup 50 disposed on the substrate 10, and an encapsulant 60 received in the reflecting cup 50 and covering the LED chip 20.

The substrate 10 is made of $Al_2O_3$, silicon, SiC, ceramic, polymer, or electrically insulating quartz. The electrical member 12 comprises a first electrical member 120 and a second electrical member 122 spaced from the first electrical member 120. The first electrical member 120 and the second electrical member 122 respectively extend from a top face of the substrate 10 to a bottom face thereof along an outer edge of the substrate 10, whereby the LED package is formed as a surface mounting type device.

The heat-dissipating member 14 comprises a first heat-dissipating member 140 formed on the first electrical member 120 and a second heat-dissipating member 142 formed on the second electrical member 122. The first heat-dissipating member 140 comprises a first main body 1400 formed on the first electrical member 120 and a plurality of first fins 1402 extending outwardly from the first main body 1400. The second heat-dissipating member 142 comprises a second main body 1420 formed on the second electrical member 122 and a plurality of second fins 1422 extending outwardly from the second main body 1420. The first main body 1400 is perpendicular to the first electrical member 120. The first fins 1402 are parallel to and spaced from each other. The first fins 1402 are perpendicular to the first main body 1400. The first fins 1402 extend from the first main body 1400 and through the reflecting cup 50 to expose to an outside of the reflecting cup 50. The second main body 1420 is perpendicular to the second electrical member 122. The second fins 1422 are parallel to and spaced from each other. The second fins 1422 extend from the second main body 1420 and through the reflecting cup 50 to expose to the outside of the reflecting cup 50. The first main body 1400 and the second main body 1420 respectively extend through the reflecting cup 50.

The LED chip 20 is mounted on the first electrical member 120 of the substrate 10. The LED chip 20 comprises a semiconductor structure 21, and a first electrode 22 and a second electrode 23 disposed on a top face of the semiconductor structure 21. The first electrode 22 is electrically connected to the first electrical member 120 via one wire 40, and the second electrode 23 is electrically connected to the second electrical member 122 of via the other wire 40. The wires 40 are preferably made of gold.

The reflecting cup 50 surrounds the LED chip 20. The reflecting cup 50 is made of a mixture which includes titanium dioxide (TiO2), hardener, and a compound of epoxy resin and silicone. Preferably, the substrate 10 and the reflecting cup 50 can be formed integrally as a single piece by the same material.

The encapsulant 60 is made of transparent materials, such as silicone, epoxy, quartz, or glass. In the present embodiment, the encapsulant 60 further includes fluorescent powder 70 mixed therein, such as YAG, TAG, silicate, nitride, nitrogen oxides, phosphide, arsenide, telluride or sulfide powder. The fluorescent powder 70 is used for changing color of light from the LED chip 20 into a different color.

In use, when the LED package is activated, heat generated by the LED chip 20 is transferred to the electrical member 12 on which the heat-dissipating member 14 is formed, thereby helping dissipation of heat from the LED chip 20 to the environment.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode (LED) package, comprising:
   a substrate;
   an electrical member formed on the substrate, the electrical member comprising a first electrical member and a second electrical member both extending from a top face of the substrate to a bottom face of the substrate along an outer edge of the substrate;
   a heat-dissipating member formed on the electrical member;
   an LED chip mounted on the electrical member and electrically connected to the first electrical member and the second electrical member; and
   a reflecting cup disposed on the substrate and surrounding the LED chip;

wherein the heat-dissipating member comprises a main body and a plurality of fins extending outwardly from the main body; and wherein the main body extends through the reflecting cup.

2. The LED package of claim 1, wherein the fins are perpendicular to the main body.

3. The LED package of claim 1, wherein the fins extend from the main body and through the reflecting cup to expose to an outside of the reflecting cup.

4. The LED package of claim 1, wherein the substrate is made of one of $Al_2O_3$, silicon, SiC, ceramic, polymer, and electrically insulating quartz.

5. The LED package of claim 1, further comprising an encapsulant covering the LED chip.

6. The LED package of claim 5, wherein the encapsulant further comprises fluorescent powder mixed therein.

7. The LED package of claim 1, wherein the heat-dissipating member comprises a first heat-dissipating member formed on the first electrical member and a second heat-dissipating member formed on the second electrical member.

8. The LED package of claim 1 further comprising two wires electrically connecting the LED chip to the first electrical member and the second electrical member, respecively.

9. The LED package of claim 1, wherein each of the fins is parallel to the substrate.

10. The LED package of claim 1, wherein the reflecting cup is sandwiched between the top face of the substrate and one of the fins.

11. An LED package, comprising:
a substrate having a first electrical member and a second electrical member, the first electrical member and the second electrical member respectively extending from a top face of the substrate to a bottom face of the substrate along an outer edge of the substrate;
an LED chip mounted on the first electrical member of the substrate and electrically connected to the first and second electrical members via two wires;
a heat-dissipating member formed on the first electrical member; and
a reflecting cup disposed on the substrate and surrounding the LED chip;
wherein the heat-dissipating member comprises a main body and a plurality of fins extending outwardly from the main body; and
wherein the main body extends through the reflecting cup.

12. The LED package of claim 11, wherein the fins are perpendicular to the main body.

13. The LED package of claim 11, wherein the fins extend from the main body and through the reflecting cup to expose to an outside of the reflecting cup.

14. The LED package of claim 11, wherein the reflecting cup is sandwiched between the top face of the substrate and one of the fins.

* * * * *